US006483889B2

(12) United States Patent
Kim et al.

(10) Patent No.: US 6,483,889 B2
(45) Date of Patent: Nov. 19, 2002

(54) SHIFT REGISTER CIRCUIT

(75) Inventors: Byeong Koo Kim, Kyoungsangbuk-do (KR); Soon Kwang Hong, Kyoungsangbuk-do (KR); Ju Cheon Yeo, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/893,987

(22) Filed: Jun. 29, 2001

(65) Prior Publication Data

US 2002/0044625 A1 Apr. 18, 2002

(30) Foreign Application Priority Data

Aug. 30, 2000 (KR) ........................................ 00-50907

(51) Int. Cl.[7] ........................................ G11C 19/00
(52) U.S. Cl. ........................ 377/54; 377/27; 345/98; 345/100
(58) Field of Search .................... 345/98, 100; 377/54, 377/27

(56) References Cited

U.S. PATENT DOCUMENTS 5,701,136 A * 12/1997 Huq et al. .................. 345/100
6,232,949 B1 * 5/2001 Imamura .................... 345/100
6,236,393 B1 * 5/2001 Ogawa et al. .............. 345/211
6,339,631 B1 * 1/2002 Yeo et al. .................... 377/64

* cited by examiner

*Primary Examiner*—Margaret R. Wambach
(74) *Attorney, Agent, or Firm*—Morgan, Lewis & Bockius LLP

(57) ABSTRACT

A shift register circuit is provided that is adaptive for reducing a swing width of a clock voltage. In the shift register, a plurality of stages, one for each scanning line, generate first driving signals in response to first and second clock signals. A level shifter is connected between each the stages and its respective scanning line to receive the first driving signal, to thereby apply a second driving signal having a larger swing width than the first driving signal to the scanning line.

23 Claims, 8 Drawing Sheets

C1 C2 C3 C4 SP
$12_1$ 1ST STAGE — $13_1$ 1ST LEVEL SHIFTER — $14_1$ ROW1
g1 $12_2$ 2ND STAGE — $13_2$ 2ND LEVEL SHIFTER — $14_2$ ROW2
g1 $12_3$ 3RD STAGE — $13_3$ 3RD LEVEL SHIFTER — $14_3$ ROW3
g1 $12_4$ 4TH STAGE — $13_4$ 4TH LEVEL SHIFTER — $14_4$ ROW4
g4
gn $12_n$ nTH STAGE — $13_n$ nTH LEVEL SHIFTER — $14_n$ ROWn

SHIFT REGISTER CIRCUIT

This application claims the benefit of Korean Patent Application No. P2000-50907, filed on Aug. 30, 2000, which is hereby incorporated by reference.

BACKGROUND OF THE INVENTION

1. Field of the Invention

This invention relates to driving circuitry for a liquid crystal display, and more particularly, to a shift register of a liquid crystal display driving circuit.

2. Description of the Related Art

Generally, a liquid crystal display (LCD) displays pictures by varying light transmissivity in the liquid crystal with selective application of electric field to the liquid crystal panel. In a matrix type LCD, pixel cells are arranged at intersections between data lines and scanning lines (e.g., gate lines). The data lines receive picture data from a data driver while the scanning lines receive scanning pulses from a scanning driver. The scanning driver includes a plurality of shift registers that sequentially apply the scanning pulses to the scanning lines.

FIG. 1 is a block circuit diagram showing a configuration of a related art shift register. Referring to FIG. 1, the related art shift register includes n stages $\mathbf{2}_1$ to $\mathbf{2}_n$ in cascade configuration and connected to respective n row lines ROW1 to ROWn via output lines $\mathbf{4}_1$ to $\mathbf{4}_n$. A start pulse SP is input to the first stage $\mathbf{2}_1$, and each of the second to n-th stages $\mathbf{2}_2$ to $\mathbf{2}_n$ receives an output signal from its respective previous stage. Each of stages $\mathbf{2}_1$ to $\mathbf{2}_n$ is coupled to a row line ROWi connected to a pixel train and is selected using two of four clock signals C1 to C4.

FIG. 2 is a detailed circuit diagram showing the i-th stage and (i+1)-th stage of the related art shift register. Referring to FIG. 2, the i-th stage $\mathbf{2}_i$ includes second and fourth NMOS transistors T2 and T4 connected to a ground voltage VSS, a third NMOS transistor T3 connected to a supply voltage VCC, fifth and sixth NMOS transistors T5 and T6 connected to the output line $\mathbf{4}_i$, and a first NMOS transistor T1 supplied with an output signal $g_{i-1}$ at the previous stage.

The output signal $g_{i-1}$ present at the previous stage is applied to gate terminals of the first and fourth NMOS transistors T1 and T4. Drain terminals of the second NMOS transistor T2, the fourth NMOS transistor T4 and the sixth NMOS transistor T6 are connected to a ground voltage VSS. Gate terminals of the second and sixth NMOS transistors T2 and T6 are connected to a source terminal of the fourth NMOS transistor T4 and a drain terminal of the third NMOS transistor T3. The first and third clock signals C1 and C3 are applied to the i-th stage $\mathbf{2}_i$, as shown in FIG. 2.

An operation process of the i-th stage $\mathbf{2}_i$ will be explained with reference to FIG. 3 below. First, the third clock signal C3 is applied to the gate terminal of the third NMOS transistor T3. If the third clock signal C3 is applied, then the third NMOS transistor T3 is turned on. When the third NMOS transistor T3 is turned on, a supply voltage VCC is applied to a second node P2 to turn on the second and sixth NMOS transistors T2 and T6. At this time, a first node P1 and the output line $\mathbf{4}_i$ are initialized at the ground voltage VSS.

Subsequently, the output signal $g_{i-1}$ at the previous stage is applied as a start pulse. If the output signal $g_{i-1}$ from the previous stage is applied, then the first and fourth NMOS transistors T1 and T4 are turned on. When the fourth NMOS transistors T4 is turned on, a second node P2 is connected to the ground voltage VSS to turn off the second and sixth NMOS transistors T2 and T6. On the other hand, when the first NMOS transistor T1 is turned on, the output signal $g_{i-1}$ from the previous stage is applied to the first node P1. At this time, the fifth NMOS transistor T5 connected to the first node P1 is turned on.

After turning on the fifth NMOS transistor T5, the first clock signal C1 is applied to the source terminal of the fifth NMOS transistor T5. The first clock signal C1 applied upon turn-on of the fifth NMOS transistor T5 is applied to the output line $\mathbf{4}_i$. In other words, the i-th output line $\mathbf{4}_i$ is selected. After the clock voltage signal C1 is applied to the output line $\mathbf{4}_i$, the first clock signal C1 is inverted into a low logic and thus the output line $\mathbf{4}_i$ also is supplied with a logic low voltage (i.e., a ground voltage).

Typically, a gate line swing voltage of the related art LCD is approximately 20 to 25V. In order to fulfill this swing voltage, swing voltages of the clock signals C1 to C4 input to the shift register should be set to more than 20V.

When the shift register is configured with NMOS transistors as shown in FIG. 2, clock signals C1 to C4 of 0 to 20V should be inputted for an application of a swing voltage of 20V to the gate line. On the other hand, when the shift register is configured with PMOS transistors, clock signals C1 to C4 of −8 to −12V should be inputted for an application of a swing voltage of 20V to the gate line. In other words, in the related art shift register, clock signals C1 to C4 having a large swing width are inputted from an external circuit (not shown) to the stages $\mathbf{2}_1$ to $\mathbf{2}_n$.

The external circuit for supplying the clock signals C1 to C4 is configured within a single integrated circuit (IC) chip. The single IC chip generates clock signals C1 to C4 having a large swing width and applies them to the stages $\mathbf{2}_1$ to $\mathbf{2}_n$.

However, while the external circuit of the related art (configured within the single IC chip) easily creates pulse signals having a low voltage (e.g., 0 to 10V), it has difficulty creating a voltage signal more than this low voltage or voltage signals at negative values. In other words, it is difficult to maintain reliable device characteristics according to the related art single IC chip because the external circuit has difficulty creating high voltages (e.g., more than 10V) and negative voltages. Thus, a high voltage or a negative voltage created by means of a single IC chip can cause erroneous operation resulting in adversely affected device characteristics.

SUMMARY OF THE INVENTION

Accordingly, the present invention is directed to a shift register circuit that substantially obviates one or more of the problems due to limitations and disadvantages of the related art.

In one aspect of the present invention, a shift register provides a reduced swing width of a clock voltage.

Additional features and advantages of the invention will be set forth in the description that follows; and in part will be apparent from the description, or may be learned by practice of the invention. The objectives and other advantages of the invention will be realized and attained by the structure particularly pointed out in the written description and claims hereof as well as the appended drawings.

To achieve these and other advantages in accordance with the present invention, as embodied and broadly described, the shift register circuit according to the present invention includes a plurality of stages, each of the plurality of stages associated with a respective one of a plurality of scanning lines for generating a first driving signal in response to first and second clock signals, and a plurality of level shifters, each of the level shifters being connected between one of the plurality of stages and its associated scanning line for applying a second driving signal to the scanning line in response to the first driving signal, wherein the second driving signal has a larger swing width than the first driving signal.

In another aspect of the present invention, a shift register circuit of the present invention includes a plurality of stages, each of the plurality of stages associated with a respective one of a plurality of scanning lines for generating a first driving signal in response to first and second clock signals, and a plurality of level shifters, each of the level shifters being connected between one of the plurality of stages and its associated scanning line for applying a second driving signal to the scanning line in response to the first driving signal, wherein the second driving signal has a larger swing width than the first driving signal, wherein the stages and the level shifters are configured within a single chip.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Reference will now be made in detail to the exemplary embodiments of the present invention, examples of which are illustrated in the accompanying drawings.

Figure 1:
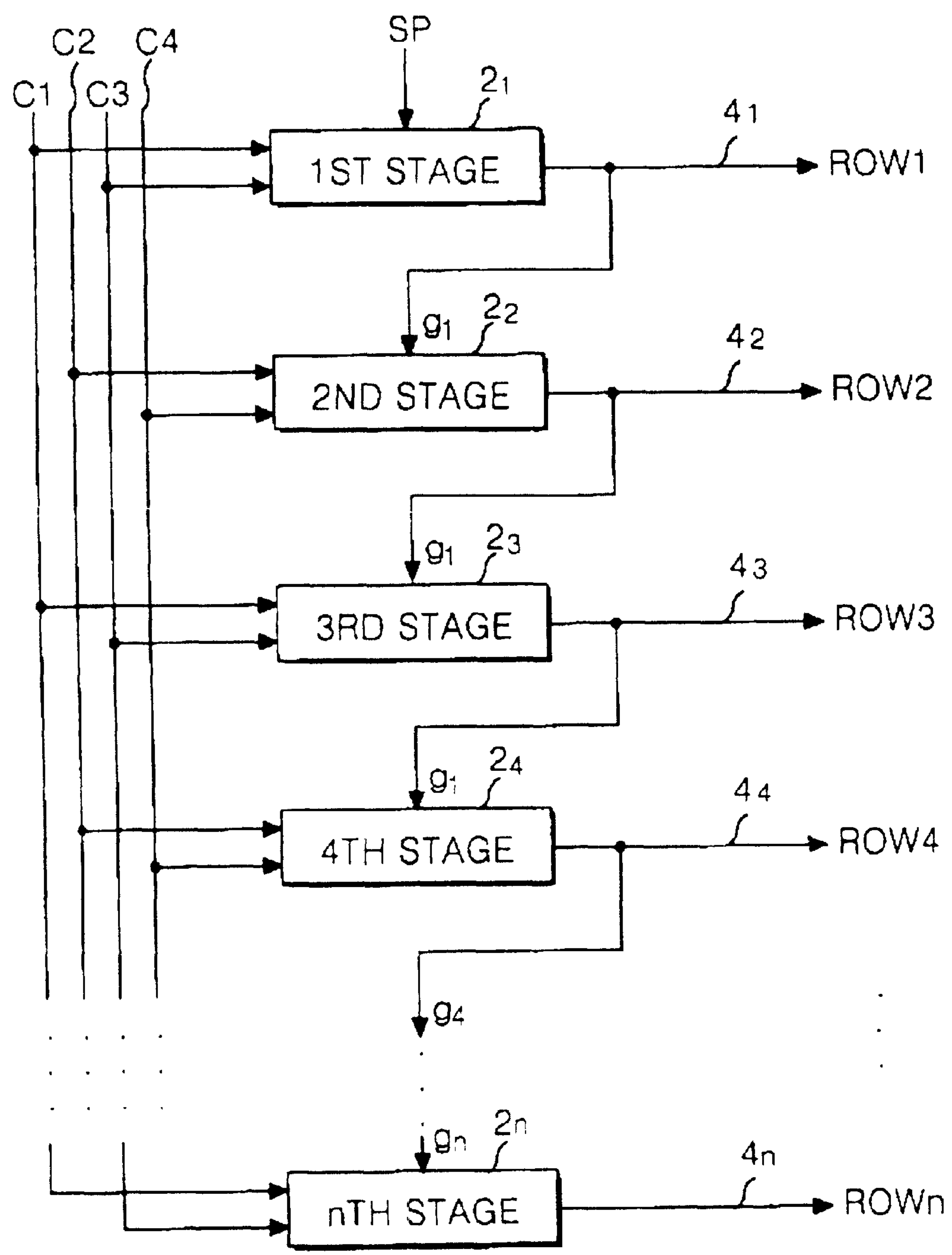
FIG. 1 provides a schematic block circuit diagram illustrative of a related art shift register.
Figure 2:
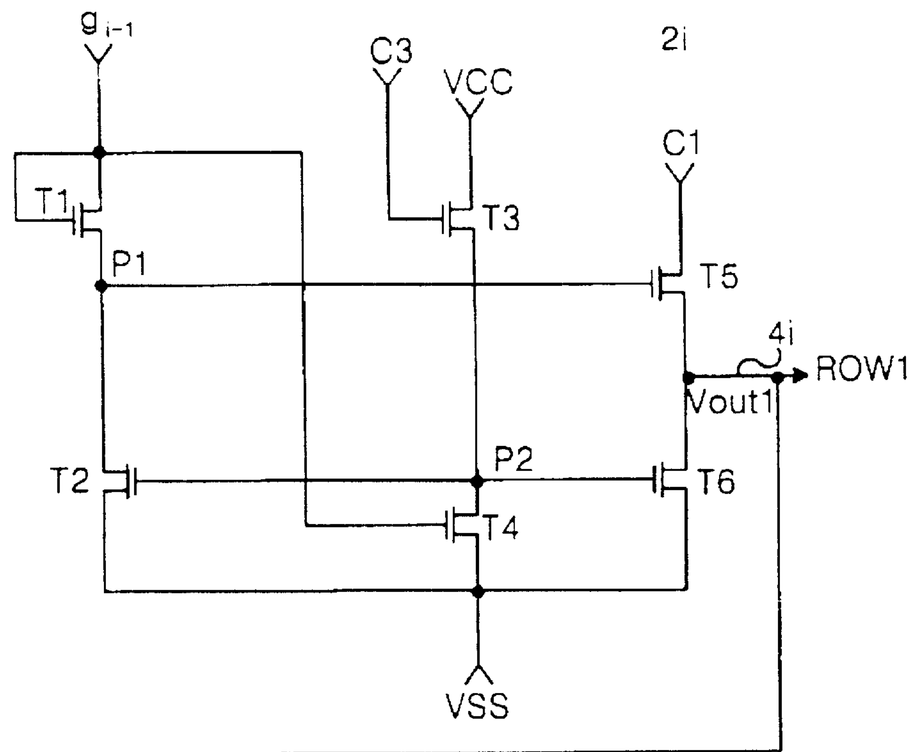
FIG. 2 is a detailed circuit diagram of two stages of the shift register shown in FIG. 1.
Figure 2:
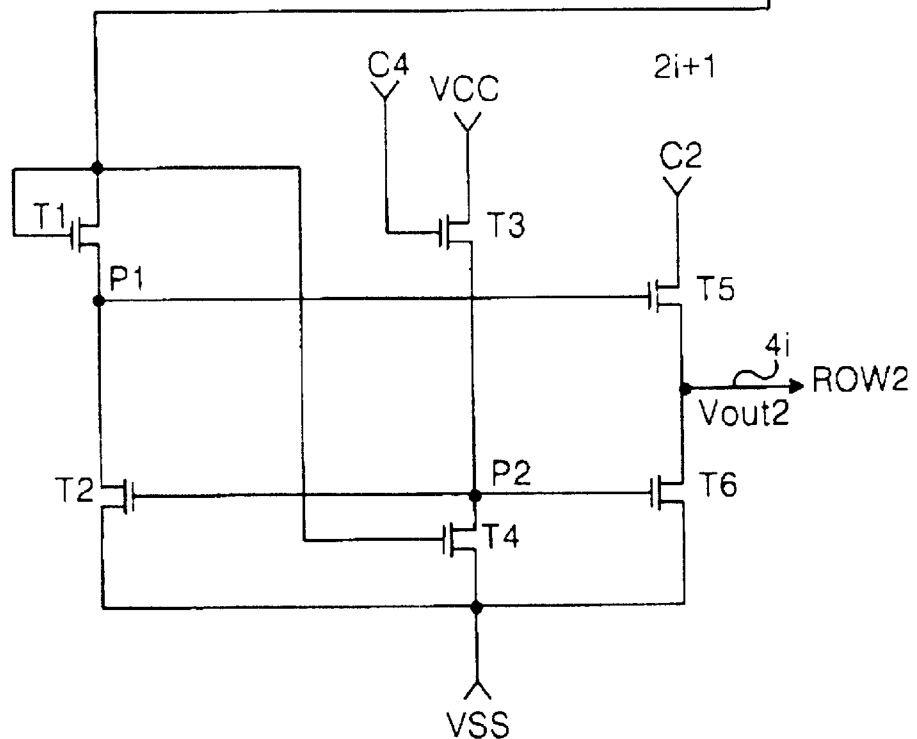
Figure 3:
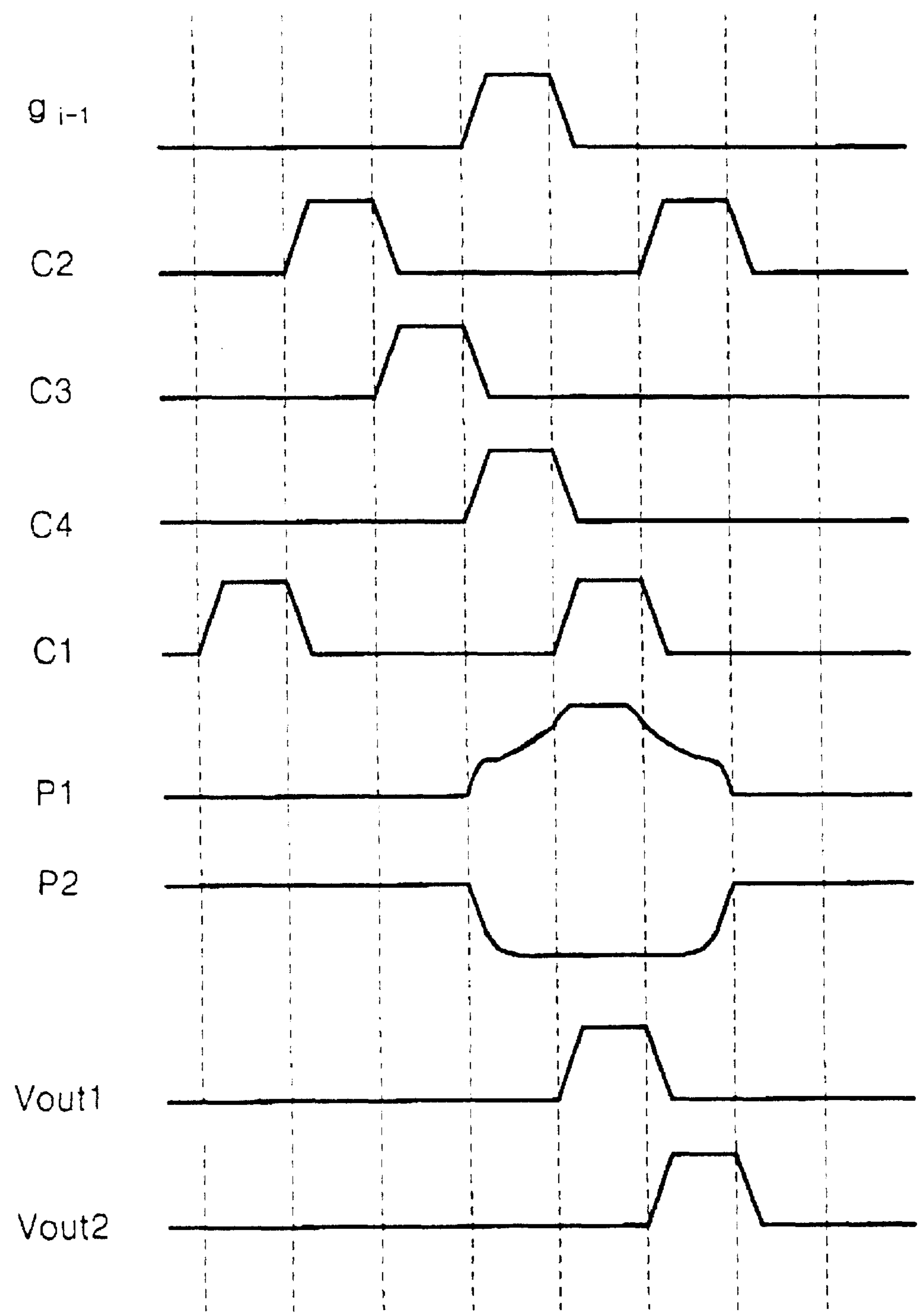
FIG. 3 is a waveform diagram illustrative of driving signals applied to the stages shown in FIG. 2.
Figure 4:
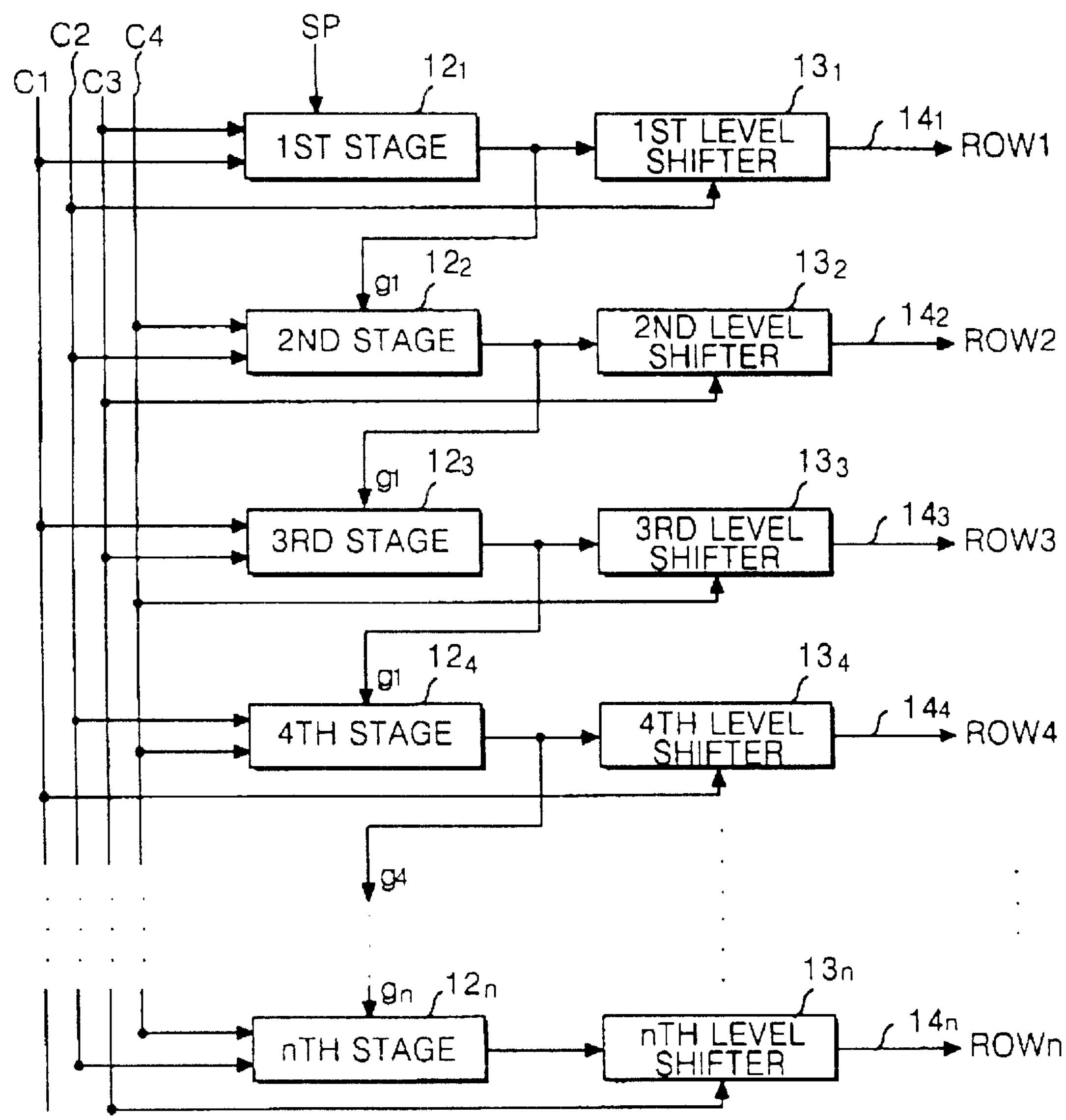
FIG. 4 is a schematic block circuit diagram showing a configuration of an exemplary shift register according to a first embodiment of the present invention.

Referring to FIG. 4, there is shown a shift register circuit according to a first exemplary embodiment of the present invention. As shown in FIG. 4, the shift register circuit includes n stages $\mathbf{12}_1$, to $\mathbf{12}_n$ in cascade configuration. Each stage $\mathbf{12}_i$ is connected to a respective one of n row lines ROW1 to ROWn via output lines $\mathbf{14}_1$, to $\mathbf{14}_n$, and n level shifters $\mathbf{13}_1$ to $\mathbf{13}_n$ are provided between the output lines $\mathbf{14}_1$ to $\mathbf{14}_n$ and the stages $\mathbf{12}_1$ to $\mathbf{12}_n$. Register stages $\mathbf{12}_1$ to $\mathbf{12}_n$ and level shifters $\mathbf{13}_1$ to $\mathbf{13}_n$ may be configured within a single chip.

Generally, the shift register of the present invention operates by inputting a start pulse SP to the first stage while output signals present at the previous stages are applied to respective second to nth stages $\mathbf{12}_2$ to $\mathbf{12}_n$. Each of these stages $\mathbf{12}_1$ to $\mathbf{12}_n$ selects a row line ROWi connected to a pixel train according to two of four clock signals C1 to C4, and each of the level shifters $\mathbf{13}_1$ to $\mathbf{13}_n$ is supplied with another one of the four clock signals C1 to C4. For example, the first and third clock signals C1 and C3 are input to the first stage $\mathbf{12}_1$ while the second clock signal C2 is input to the first level shifter $\mathbf{13}_1$. However, it is to be understood that the clock signal input to the first level shifter $\mathbf{13}_1$ may be selected by any one of the clock signals having not been inputted to the first stage $\mathbf{12}_1$. The level shifters $\mathbf{13}_1$ to $\mathbf{13}_n$ shift the levels of output signals from stages $\mathbf{12}_1$ to $\mathbf{12}_n$ and apply the level-shifted signals to the output lines $\mathbf{14}_1$ to $\mathbf{14}_n$.

Figure 5:
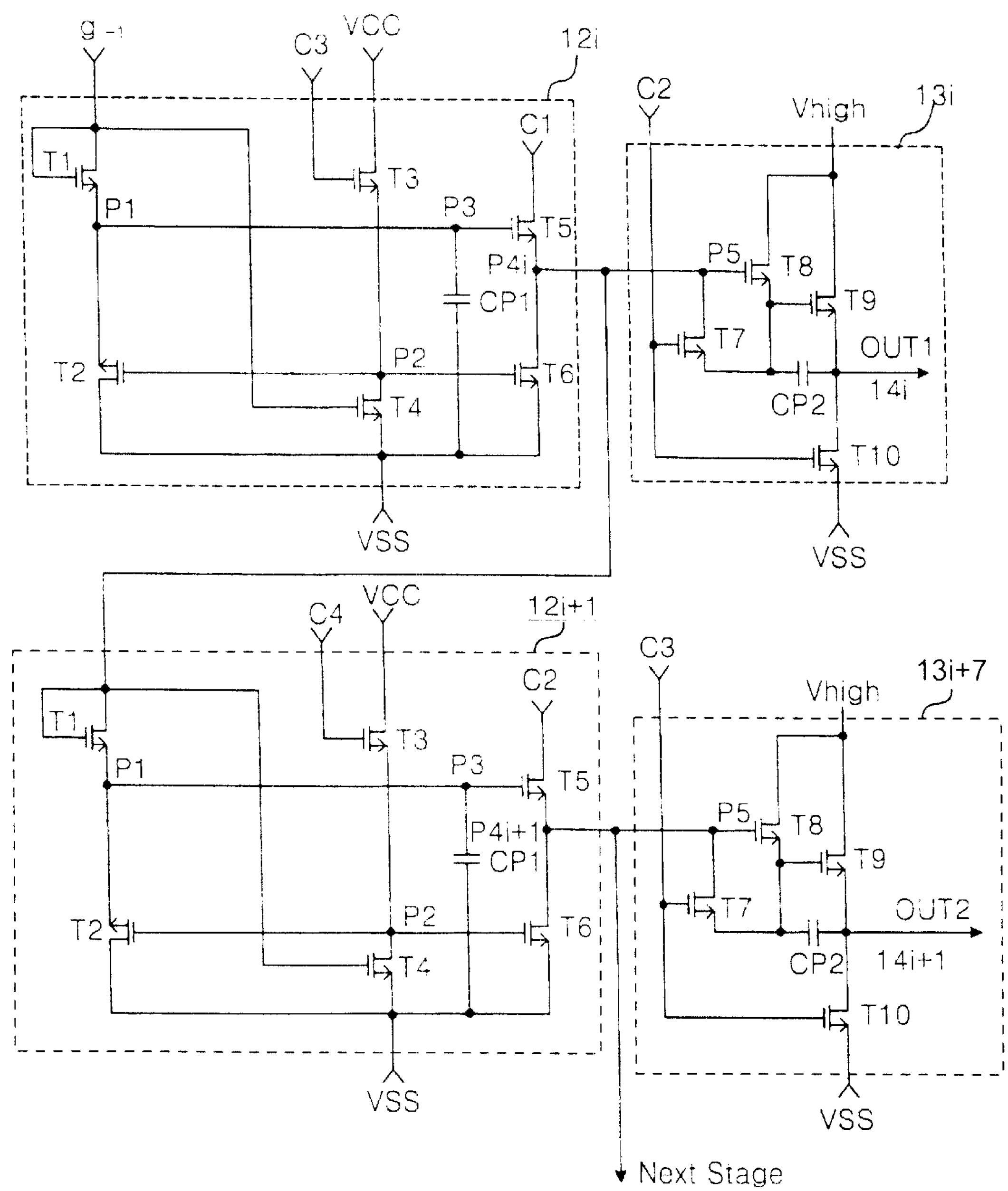
FIG. 5 illustrates a circuit diagram of two stages and related level shifters of the exemplary shift register shown in FIG. 4.
Figure 6:
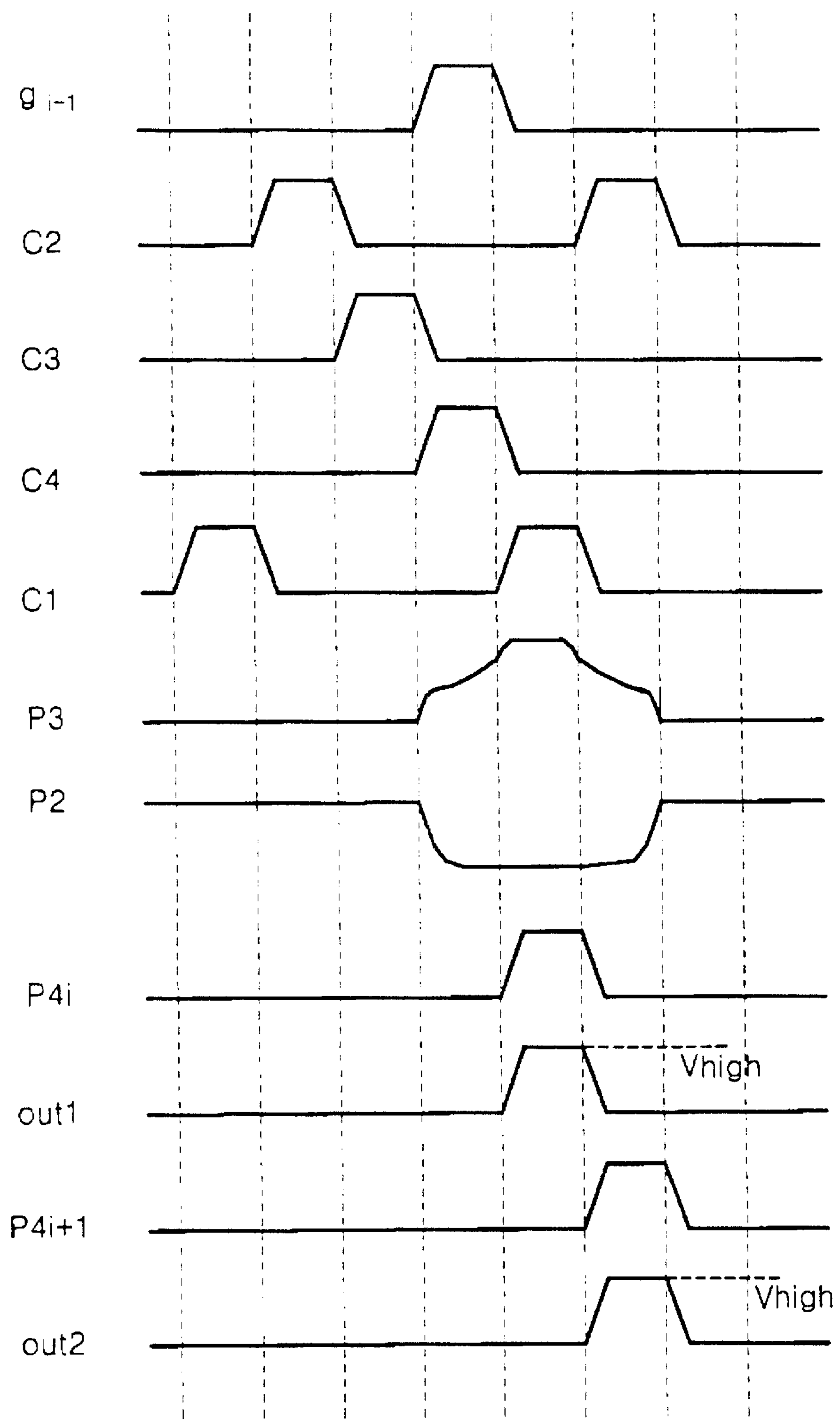
FIG. 6 is an exemplary waveform diagram of driving signals applied to the stages and the level shifters shown in FIG. 5.

FIG. 5 is a detailed circuit diagram of a stage and a level shifter according to a first exemplary embodiment of the present invention. In FIG. 5, the i-th stage $\mathbf{12}_i$ includes second and fourth NMOS transistors T2 and T4 connected to a ground voltage VSS, a third NMOS transistor T3 connected to a supply voltage VCC, fifth and sixth NMOS transistors T5 and T6 connected to the level shifter $\mathbf{13}_i$, and a first NMOS transistor T1 supplied with an output signal $g_{i-1}$ present at the previous stage.

As shown in FIG. 5, the output signal $g_{i-1}$ present at a stage previous to the i-th stage $\mathbf{12}_i$ is applied to gate terminals of the first and fourth NMOS transistors Ti and T4. The drain terminal of the second NMOS transistor T2, and the source terminals of the fourth NMOS transistor T4 and the sixth NMOS transistor T6 are connected to a ground voltage VSS. Gate terminals of the second and sixth NMOS transistors T2 and T6 are connected to a drain terminal of the fourth NMOS transistor T4 and a source terminal of the third NMOS transistor T3. A first capacitor CP1 is provided between the gate terminal of the fifth NMOS transistor T5 and the ground voltage VSS.

The i-th level shifter $\mathbf{13}_i$ includes seventh and eighth NMOS transistors T7 and T8 connected to the i-th stage $\mathbf{12}_i$ and ninth and tenth NMOS transistors T9 and T10 connected to the output line $\mathbf{14}_i$.

A second clock signal C2, for example, is input to gate terminals of the seventh and tenth NMOS transistors T7 and T10. The gate terminal of the eighth NMOS transistor T8 and the drain terminal of the seventh NMOS transistor T7 are connected to the output of the stage $\mathbf{12}_i$. A high voltage $V_{high}$ is applied to the drain terminals of the eighth and ninth NMOS transistors T8 and T9. The drain terminal of the tenth NMOS transistor T10 and the source terminal of the ninth NMOS terminal are connected to the output line $\mathbf{14}_i$. The source terminal of the tenth NMOS transistor T10 is connected to the ground voltage VSS. A second capacitor CP2 is connected between the output line and the source terminal of the seventh NMOS transistor T7.

First, the third clock signal C3 is applied to the gate terminal of the third NMOS transistor T3. If the third clock signal C3 is high, then the third NMOS transistor T3 is turned on. When the third NMOS transistor T3 is turned on, a voltage VCC is applied to a second node P2 to turn on the second and sixth NMOS transistors T2 and T6. At this time, a first node P1 and the output line $\mathbf{14}_i$ are initialized to the ground voltage VSS.

Subsequently, the output signal $g_{i-1}$ at the previous stage is applied as a start pulse. If the output signal $g_{i-1}$ at the previous stage is high, then the first and fourth NMOS transistors T1 and T4 are turned on. When the fourth NMOS transistors T4 is turned on, a second node P2 is connected to the ground voltage VSS to turn off the second and sixth NMOS transistors T2 and T6. On the other hand, when the first NMOS transistor T1 is turned on, the output signal $g_{i-1}$ at the previous stage is applied to the first node P1 and to the third node P3. Accordingly, a voltage corresponding to signal $g_{i-1}$ is charged in the first capacitor CP1 connected to the third node P3, and the fifth NMOS transistor T5 turns on (by the voltage charged in the first capacitor CP1). Thus, the first and second NMOS transistors T1 and T2 and the third and fourth NMOS transistors T3 and T4 act as controllers for controlling an output part of the shift register that includes the fifth and sixth NMOS transistors T5 and T6.

After the fifth NMOS transistor T5 turns on, the first clock signal C1 goes high and the signal C1 is applied to a fourth node $P4_i$. Consequently, a desired voltage generated at the fourth node P4i is supplied to the level shifter $13_i$. After supplying the desired voltage to the level shifter $13_i$, the first clock signal C1 is inverted into a logic low level. Thus, the first and second NMOS transistors T1 and T2 and the third and fourth NMOS transistors T3 and T4 act as controllers for controlling an output part of the shift register that includes the fifth and sixth NMOS transistors T5 and T6.

Meanwhile, the desired voltage supplied to the fourth node $P4_i$ is applied to a fifth node P5, and the eighth NMOS transistor T8 is caused to turn on. When the eighth NMOS transistor T8 is turned on, a high voltage $V_{high}$ is applied to the second capacitor CP2. The second capacitor CP2 charges the high voltage $V_{high}$ and discharges the charged voltage.

A voltage discharged from the second capacitor CP2 turns on the ninth NMOS transistor T9. When the ninth NMOS transistor T9 is turned on, a high voltage $V_{high}$ is applied to the output line $14_i$. In other words, a desired output voltage emerges at the output line $14_i$. When the second capacitor CP2 is completely discharged, the ninth NMOS transistor T9 turns off.

Thereafter, the second clock signal C2 is applied to the gate terminal of the seventh NMOS transistor T7 to turn on the seventh and tenth NMOS transistors T7 and T10. When the tenth NMOS transistor T10 turns on, the output line $14_i$ is connected to the ground voltage VSS. Thus, the ninth and tenth NMOS transistors T9 and T10 act as output circuitry that applies either the ground voltage VSS or the high voltage $V_{high}$ to the output line $14_i$.

On the other hand, when the seventh NMOS transistor T7 is turned on, the output line $14_i$ is connected to the fifth node P5 at which no voltage is applied. Consequently, the second capacitor CP2 maintains a low voltage and the ninth NMOS transistor T9 turns off. Thus, the seventh and eighth NMOS transistors T7 and T8 act as control circuitry controlling the output In the first exemplary embodiment, the clock signals C1 to C4 have a swing width of about 0 to 10V. In this case, the high voltage $V_{high}$ is set to have a value of about 15 to 25V. In other words, in the first embodiment, a low voltage of less than 10V can be applied to the stages $12_1$ to $12_n$.

Alternatively, the transistors in the first embodiment may be replaced by other switching element types that include an input terminal, an output terminal, and a control terminal, such as a PMOS transistor. In the case of a PMOS transistor, clock signals C1 to C4 may have a swing width of about 0 to 10V. For example, the high voltage $V_{high}$ may be set to about −8V while the ground voltage VSS is set to about 10V.

Figure 7:
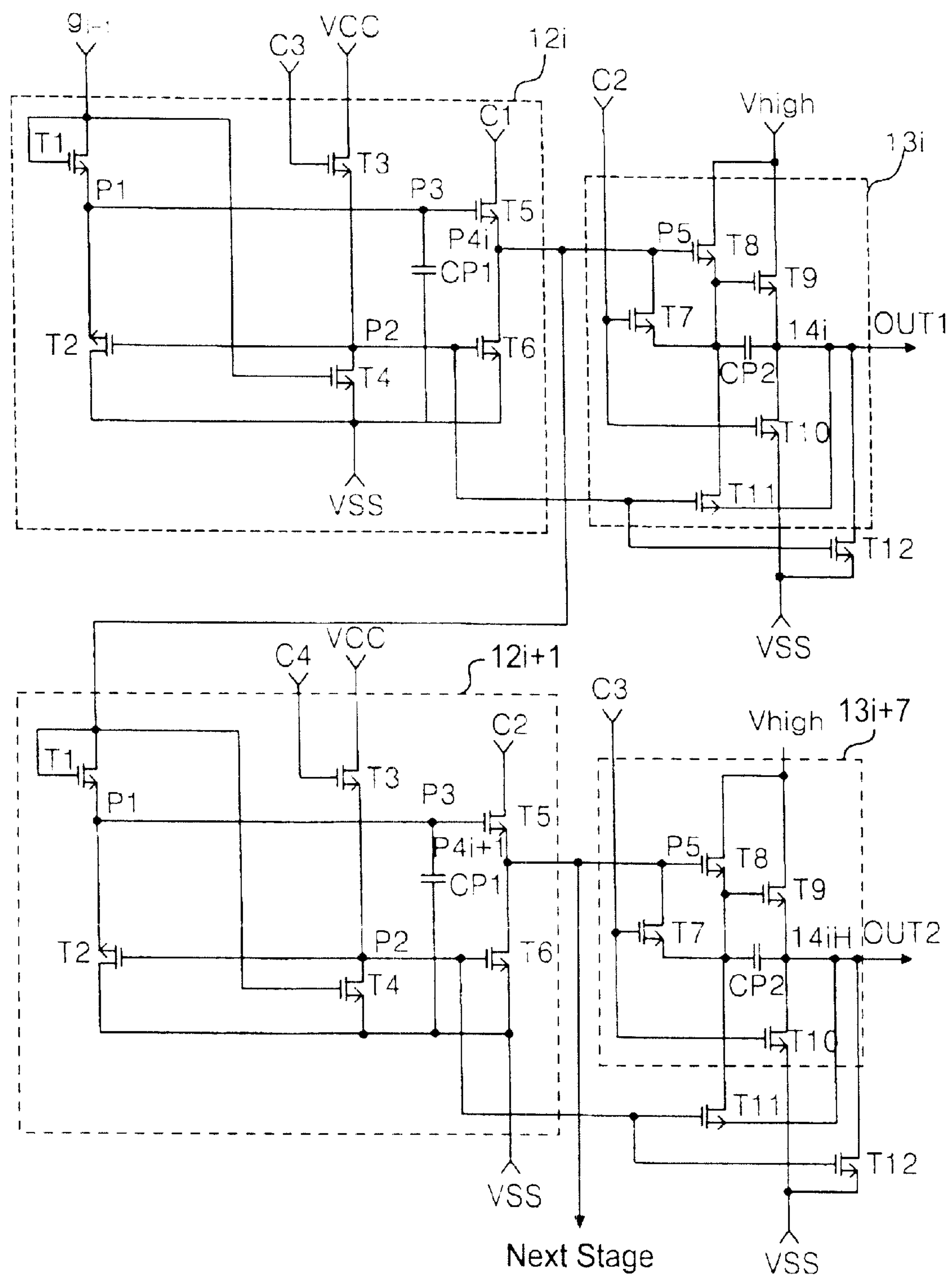
FIG. 7 illustrates a detailed circuit diagram of an exemplary stage and a level shifter in a shift register according to a second embodiment of the present invention.

FIG. 7 is a detailed circuit diagram of a stage and a level shifter according to a second embodiment of the present invention. In FIG. 7, the i-th stage $12_i$ includes second and fourth NMOS transistors T2 and T4 connected to a ground voltage VSS, a third NMOS transistor T3 connected to a supply voltage VCC, fifth and sixth NMOS transistors T5 and T6 connected to the level shifter $13_i$, and a first NMOS transistor T1 supplied with an output signal $g_{i-1}$ of the previous stage.

The output signal $g_{i-1}$ of the previous stage is applied to gate terminals of the first and fourth NMOS transistors T1 and T4. The drain terminal of the second NMOS transistor T2, and the source terminals of the fourth NMOS transistor T4 and the sixth NMOS transistor T6 are connected to a ground voltage VSS. Gate terminals of the second and sixth NMOS transistors T2 and T6 are connected to a drain terminal of the fourth NMOS. transistor T4 and a source terminal of the third NMOS transistor T3. A first capacitor CP1 is provided between the gate terminal of the fifth NMOS transistor T5 and the ground voltage VSS.

The i-th level shifter $13_i$ includes seventh and eighth NMOS transistors T7 and T8 connected to the output of the i-th stage $12_i$, and ninth and tenth NMOS transistors T9 and T10 connected to the output line $14_i$.

A second clock signal C2 is inputted to gate terminals of the seventh and tenth NMOS transistors T7 and T10. The gate terminal of the eighth NMOS transistor T8 and the drain terminal of the seventh NMOS transistor T7 are connected to the output of the stage $12_i$. A high voltage $V_{high}$ is applied to the drain terminals of the eighth and ninth NMOS transistors T8 and T9. The drain terminal of the tenth NMOS transistor T10 and the source terminal of the ninth NMOS terminal are connected to the output line $14_i$. The source terminal of the tenth NMOS transistor T10 is connected to the ground voltage VSS. A second capacitor CP2 is connected between the output line $14_i$ and the source terminal of the seventh NMOS transistor T7.

In operation, the third clock signal C3 is first applied to the gate terminal of the third NMOS transistor T3. If the third clock signal C3 is high, then the third NMOS transistor T3 is turned on. When the third NMOS transistor T3 turns on, a supply voltage VCC is applied to a second node P2 to turn on the second and sixth NMOS transistors T2 and T6. At this time, a first node P1 and the output line $14_i$ are initialized at the ground voltage VSS.

Subsequently, the output signal $g_{i-1}$ of the previous stage is applied as a start pulse. If the output signal $g_{i-1}$ present at the previous stage is high, then the first and fourth NMOS transistors T1 and T4 are turned on. When the fourth NMOS transistors T4 is turned on, a second node P2 is connected to the ground voltage VSS and turns off the second and sixth NMOS transistors T2 and T6.

On the other hand, when the first NMOS transistor T1 is turned on, the output signal $g_{i-1}$ present at the previous stage is applied to the first node P1. A voltage corresponding to the output signal $g_{i-1}$ at the previous stage that is applied to the first node P1 also is applied to the third node P3. Accordingly, the corresponding voltage is charged in the first capacitor CP1 connected to the third node P3, and the fifth NMOS transistor T5 turns on by the voltage charged in the first capacitor CP1.

After the fifth NMOS transistor T5 turns on, the first clock signal C1 goes high and is applied to a fourth node $P4_i$. Consequently, a desired voltage is generated at the fourth node $P4_i$ and is supplied to the level shifter $13_i$. After supplying the desired voltage to the level shifter $13_i$, the first clock signal C1 is inverted into a logic low level. Similar. to the first exemplary embodiment, the first and second NMOS transistors T1 and T2 and the third and fourth NMOS transistors T3 and T4 act as controllers for controlling an output part of the shift register that includes the fifth and sixth NMOS transistors T5 and T6.

Meanwhile, the desired voltage generated at the fourth node P4$_i$ is applied to a fifth node P5, and the eighth NMOS transistor T8 turns on. When the eighth NMOS transistor T8 turns on, a high voltage $V_{high}$ is applied to the second capacitor CP2. The second capacitor CP2 charges the high voltage $V_{high}$ and discharges the charged voltage.

A voltage discharged from the second capacitor CP2 turns on the ninth NMOS transistor T9. When the ninth NMOS transistor T9 is turned on, a high voltage $V_{high}$ is applied to the output line 14$_i$. In other words, in response to a voltage signal corresponding to clock signal C1, a desired output voltage corresponding to the high voltage $V_{high}$ emerges at the output line 14$_i$. When the second capacitor CP2 is completely discharged, the ninth NMOS transistor T9 turns off.

Thereafter, the second clock signal C2 is applied to the gate terminals of the seventh and tenth NMOS transistors T7 and T10 to turns on the seventh and tenth NMOS transistors T7 and T10. When the tenth NMOS transistor T10 turns on, the output line 14$_i$ is connected to the ground voltage VSS. Thus, the ninth and tenth NMOS transistors T9 and T10 act as output circuitry that applies either the ground voltage VSS or the high voltage $V_{high}$ to the output line 14$_i$.

On the other hand, when the seventh NMOS transistor T7 is turned on, the output line 14$_i$ is connected to the fifth node P5 at which no voltage is applied. Consequently, the second capacitor CP2 maintains a low voltage and the ninth NMOS transistor T9 turns off. Thus, the seventh and eighth NMOS transistors T7 and T8 act as control circuitry controlling the output circuitry.

Meanwhile, the second capacitor CP2 is connected to the fifth node P5 rather than to the ground voltage VSS. Accordingly, the gate (control) terminal of the ninth NMOS transistor T9 (i.e., the second capacitor CP2) goes into a floated state. This state may output an undesired voltage to the output line 14$_i$.

In order to prevent this phenomenon, the shift register of the second exemplary embodiment further includes stabilization circuitry to connect the second capacitor to the low-level voltage. As shown in FIG. 7, the source and drain of an eleventh NMOS transistor T11 may be provided across capacitor CP2, and its gate terminal connected to the gate terminal of transistor T6. In addition, the source and the drain of a twelfth NMOS transistor T12 may be connected between node 14$_i$ and the ground voltage VSS, and its gate terminal connected to the gate terminal of the eleventh NMOS transistor T11.

The eleventh and twelfth transistors T11 and T12 turn on in response to receiving voltage from the second node P2. When the eleventh NMOS transistor T11 turns on, the second capacitor CP2 is connected to the output line 14$_i$. When the twelfth NMOS transistor T12 turns on, the output line 14$_i$ is connected to the ground voltage VSS. In other words, the second capacitor CP2 is initialized at the ground voltage.

In the second embodiment, the clock signals C1 to C4 have a swing width of about 0 to 10V. In this case, the high voltage $V_{high}$ is set to have a value of about 15 to 25V. In other words, in the second embodiment, a low clock voltage of less than 10V can be applied to the stages 12$_1$ to 12$_n$.

Alternatively, the transistors in the first embodiment may be replaced by other switching element types that include an input terminal, an output terminal, and a control terminal, such as a PMOS transistor. In the case of a PMOS transistor, then the clock signals C1 to C4 have a swing width of about 0 to about 10V. In this case, the high voltage $V_{high}$ is set to about −8V and the ground voltage VSS is set to about 10V.

Figure 8A:
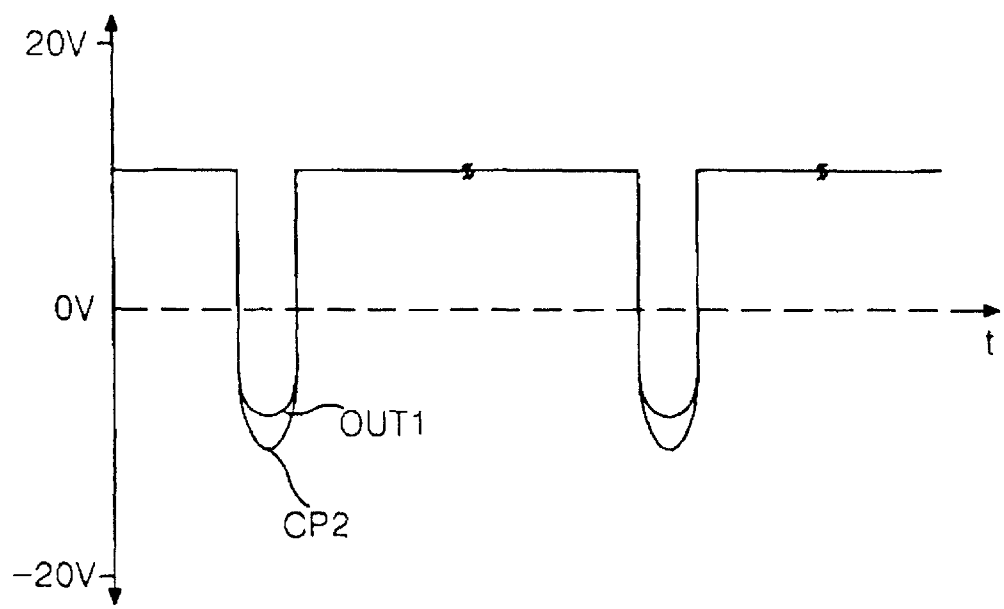
FIG. 8A and FIG. 8B are graphs illustrating simulation output waveforms of the shift register circuit shown in FIG. 7.
Figure 8B:
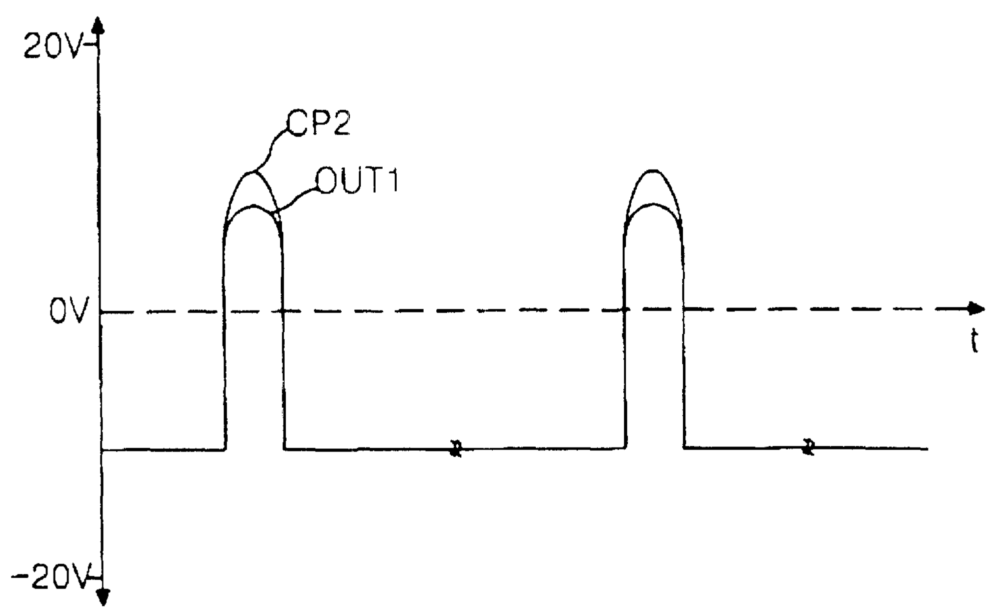

As can be seen from FIG. 8A and FIG. 8B, a maximum voltage of an output signal OUT1 is higher than that of the second capacitor CP2. This is a result of a bootstrap phenomenon occurring due to an internal capacitor of the ninth transistor T9 and the second capacitor CP2.

As described above, according to the present invention, level shifters are included in the shift register circuit, thereby reducing swing widths of the clock signals applied to the shift register circuit. Accordingly, erroneous operation of the single IC chip that creates the clock signals is substantially prevented.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A shift register circuit in a liquid crystal display having pixel cells arranged at intersections between scanning lines and data lines, the circuit comprising:

a plurality of stages, each of the plurality of stages associated with one of the scanning lines for generating a first driving signal in response to first and second clock signals; and a plurality of level shifters, each of the level shifters being connected between one of the plurality of stages and its associated scanning line for applying a second driving signal to the associated scanning line in response to the first driving signal, wherein the second driving signal has a larger swing width than the first driving signal.

2. The shift register circuit according to claim 1, wherein each of the stages is provided between a first high-level voltage supply and a low-level voltage supply.

3. The shift register circuit according to claim 2, wherein each of the stages include:

an output part for outputting any one of the first clock signal and the voltage from the low-level voltage supply to the level shifters;

first controller for controlling the output part such that the first controller receives a start pulse to cause the output part to output the first clock signal; and second controller for controlling the output part such that the second controller receives the second clock signal to cause the output part to output voltage from the low-level voltage supply from the output part.

4. The shift register circuit according to claim 3, wherein the first clock signal is the first driving signal.

5. The shift register circuit.according to claim 3, further comprising a first capacitor provided between the low-level voltage supply and a node connecting the output part and the first controller, for charging a voltage of the start pulse from the first controller and applying the charged voltage to the output part.

6. The shift register circuit according to claim 3, wherein the first controller includes:

a first transistor having a drain terminal supplied with the start pulse, a gate terminal supplied with the start pulse and a source terminal connected to the output part; and a second transistor having a source terminal connected to the source terminal of the first transistor, a drain terminal connected to the low-level voltage supply, and a gate terminal connected to the output part.

7. The shift register circuit according to claim 6, wherein the second controller includes:

a third transistor having a drain terminal connected to the first high-level voltage supply, a gate terminal supplied with the second clock signal and a source terminal connected to the gate terminal of the second transistor; and a fourth transistor having a drain terminal connected to the source terminal of the third transistor, a gate terminal supplied with the start pulse, and a source terminal connected to the low-level voltage supply.

8. The shift register circuit according to claim 6, wherein the output part includes:

a fifth transistor having a drain terminal supplied with the first clock signal, a gate terminal connected to the source terminal of the first transistor, and a source terminal connected to the level shifter; and a sixth transistor having a drain terminal connected to the source terminal of the fifth transistor, a gate terminal connected to the gate terminal of the second transistor, and a source terminal connected to the low-level voltage supply.

9. The shift register circuit according to claim 2, wherein each of the level shifters is provided between the low-level voltage supply and a second high-level voltage supply.

10. The shift register circuit according to claim 9, wherein the level shifters are supplied with a third clock signal.

11. The shift register circuit according to claim 10, wherein a voltage difference between the first high-level voltage supply and the low-level voltage supply is smaller than that between the second high-level voltage supply and the low-level voltage supply.

12. The shift register circuit according to claim 11, wherein each of the level shifters include:

output circuitry for applying any one of voltages from the second high-level voltage supply and the low-level voltage supply to the associated scanning line; and control circuitry for receiving the first driving signal and the third clock signal to control the output circuitry.

13. The shift register circuit according to claim 12, wherein the voltage from the second high-level voltage supply is the second driving signal.

14. The shift register circuit according to claim 12, wherein the output circuitry includes:

a seventh transistor having a gate terminal supplied with a third clock signal, a drain terminal connected to receive the first driving signal, and a source terminal connected to the output circuitry; and an eighth transistor having a gate terminal connected to receive the first driving signal, a drain terminal connected to the second high-level supply, and a source terminal connected to the source terminal of the seventh transistor.

15. The shift register circuit according to claim 14, wherein the control circuitry includes:

a ninth transistor having a drain terminal connected to the second high-level supply, a source terminal connected to the associated scanning line, and a gate terminal connected to the source terminal of the eighth transistor; and a tenth transistor having a drain terminal connected to the associated scanning line, a gate terminal supplied with the third clock signal, and a source terminal connected to the low-level voltage supply.

16. The shift register circuit according to claim 15, further comprising a second capacitor connected between the associated scanning line and the gate terminal of the ninth transistor.

17. The shift register circuit according to claim 8, further comprising a stabilization circuitry connected to the level shifters and the stages for stabilizing the second driving voltage applied to the associated scanning line.

18. The shift register circuit according to claim 17, further comprising a second capacitor connected between the associated scanning line and the gate terminal of the ninth transistor, wherein the stabilization circuitry connects the second capacitor to the low-level voltage supply.

19. The shift register circuit according to claim 17, wherein the stabilization circuitry includes:

an eleventh transistor having a gate terminal connected to the gate terminal of the sixth transistor, a drain terminal connected to the gate terminal of the ninth transistor, and a source terminal connected to the associated scanning line; and a twelfth transistor having a gate terminal connected to the gate terminal of the eleventh transistor, a source terminal connected to the low-level voltage supply, and a drain terminal connected to the associated scanning line.

20. The shift register circuit according to claim 16, further comprising a stabilization circuitry connected to the level shifters and the stages for stabilizing the second driving voltage applied to the associated scanning line.

21. The shift register circuit according to claim 20, wherein the stabilization circuitry connects the second capacitor to the low-level voltage supply.

22. The shift register circuit according to claim 20, wherein the stabilization circuitry includes:

an eleventh transistor having a gate terminal connected to the gate terminal of the sixth transistor, a drain terminal connected to the gate terminal of the ninth transistor, and a source terminal connected to the associated scanning line; and a twelfth transistor having a gate terminal connected to the gate terminal of the eleventh transistor, a source terminal connected to the low-level voltage supply, and a drain terminal connected to the associated scanning line.

23. A shift register circuit in a liquid crystal display having pixel cells arranged at intersections between scanning lines and data electrodes, the circuit comprising.

a plurality of stages, each of the plurality of stages associated with one of the scanning lines for generating a first driving signal in response to first and second clock signals; and a plurality of level shifters, each of the level shifters being connected between one of the plurality of stages and its associated scanning line for applying a second driving signal to the associated scanning line in response to the first driving signal, wherein the second driving signal has a larger swing width than the first driving signal, wherein the stages and the level shifters are configured within a single chip.

* * * * *